(12) United States Patent
Lv et al.

(10) Patent No.: US 11,233,095 B2
(45) Date of Patent: Jan. 25, 2022

(54) DISPLAY SUBSTRATE, MANUFACTURING METHOD THEREOF AND DISPLAY DEVICE

(71) Applicants: HEFEI BOE OPTOELECTRONICS TECHNOLOGY CO., LTD., Hefei (CN); BOE TECHNOLOGY GROUP CO., LTD., Beijing (CN)

(72) Inventors: Lei Lv, Beijing (CN); Bo Han, Beijing (CN); Fei Xu, Beijing (CN); Jie Gao, Beijing (CN); Jun Hong, Beijing (CN); Jiuyang Zhu, Beijing (CN); Mingwei Zhang, Beijing (CN); Jingyong Li, Beijing (CN); Chunmin Xu, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 55 days.

(21) Appl. No.: 16/611,956

(22) PCT Filed: Apr. 17, 2019

(86) PCT No.: PCT/CN2019/083013
§ 371 (c)(1),
(2) Date: Nov. 8, 2019

(87) PCT Pub. No.: WO2019/206000
PCT Pub. Date: Oct. 31, 2019

(65) Prior Publication Data
US 2021/0151519 A1      May 20, 2021

(30) Foreign Application Priority Data

Apr. 26, 2018   (CN) .......................... 201810386617.X

(51) Int. Cl.
*H01L 27/32*   (2006.01)
*H01L 51/56*   (2006.01)

(52) U.S. Cl.
CPC ...... *H01L 27/3218* (2013.01); *H01L 27/3216* (2013.01); *H01L 51/56* (2013.01)

(58) Field of Classification Search
None
See application file for complete search history.

(56) References Cited

U.S. PATENT DOCUMENTS

| | | | | |
|---|---|---|---|---|
| 8,451,414 B2 * | 5/2013 | Nonaka | ............ | G02F 1/133514 |
| | | | | 349/146 |
| 10,754,208 B2 * | 8/2020 | Nakanishi | ......... | G02F 1/134363 |
| | | (Continued) | | |

FOREIGN PATENT DOCUMENTS

| CN | 101887189 A | 11/2010 |
|---|---|---|
| CN | 205318057 U | 6/2016 |
| | (Continued) | |

*Primary Examiner* — J. E. Schoenholtz
(74) *Attorney, Agent, or Firm* — Kinney & Lange, P.A.

(57) ABSTRACT

A display substrate, a manufacturing method of the display substrate and a display device are provided. The display substrate includes a plurality of sub-pixels arranged in an array in a display area. The display area includes a boundary extending in non-straight line. The plurality of sub-pixels arranged in the array include a plurality of first sub-pixels whose distances to the boundary extending in non-straight line are less than a preset threshold and a plurality of second sub-pixels other than the plurality of first sub-pixels, where at least one of the first sub-pixels is smaller in area than each of the second sub-pixels.

12 Claims, 3 Drawing Sheets

(56) References Cited

U.S. PATENT DOCUMENTS

2010/0289994 A1* 11/2010 Nonaka ................ G02F 1/1368
  349/108
2019/0140026 A1* 5/2019 Nakanishi ......... G02F 1/133512
2019/0164510 A1* 5/2019 Fang .................... G09G 3/3611

FOREIGN PATENT DOCUMENTS

| CN | 107479269 A | 12/2017 |
| CN | 107505759 A | 12/2017 |
| CN | 107819020 A | 3/2018 |
| CN | 107819023 A | 3/2018 |
| CN | 108538895 A | 9/2018 |

\* cited by examiner

| manufacturing in the display area a plurality of first sub-pixels whose distances to the boundary extending in non-straight line are less than a preset threshold and a plurality of second sub-pixels other than the plurality of first sub-pixels, where at least one of the first sub-pixels is smaller in area than each of the second sub-pixels | 110 |

DISPLAY SUBSTRATE, MANUFACTURING METHOD THEREOF AND DISPLAY DEVICE

CROSS-REFERENCE TO RELATED APPLICATION

The present application is the U.S. national phase of PCT Application No. PCT/CN2019/083013 filed on Apr. 17, 2019, which claims a priority of the Chinese patent application No. 201810386617.X filed in China on Apr. 26, 2018, a disclosure of which is incorporated herein by reference in its entirety.

TECHNICAL FIELD

The present disclosure relates to the field of display technology, in particular to a display substrate, a manufacturing method of the display substrate and a display device.

BACKGROUND

With the rapid development of display technology and intelligent terminal, display products are provided with increasingly greater screen-to-body ratios. Taking bezel-less display equipment and intelligent wearable display equipment with high screen-to-body ratios in the related art for example, display areas of these products generally match with the bezels of these products, therefore the display areas have a circular-arc shaped boundary (e.g., four rounded corners of the display area).

SUMMARY

Some embodiments of the present disclosure provide a display substrate, including a plurality of sub-pixels arranged in an array in a display area, where the display area includes a boundary extending in non-straight line, the plurality of sub-pixels arranged in the array include a plurality of first sub-pixels whose distances to the boundary extending in non-straight line are less than a preset threshold and a plurality of second sub-pixels other than the plurality of first sub-pixels, and at least one of the first sub-pixels is smaller in area than each of the second sub-pixels.

In some embodiments of the present disclosure, the plurality of first sub-pixels are all smaller in area than each of the second sub-pixels.

In some embodiments of the present disclosure, in the display area, the plurality of first sub-pixels decrease in area gradually in a direction pointing from a center of the display area to the boundary extending in non-straight line of the display area.

In some embodiments of the present disclosure, the plurality of sub-pixels include sub-pixels in three colors and form a plurality of pixel units arranged in an array, where each pixel unit includes three sub-pixels in different colors and arranged in a row direction; in the display area, the plurality of first sub-pixels decrease in area gradually in the direction pointing from the center of the display area to the boundary extending in non-straight line of the display area at a granularity of at least one pixel unit each formed by multiple first sub-pixels.

In some embodiments of the present disclosure, in the direction pointing from the center of the display area to the boundary extending in non-straight line of the display area, the first sub-pixels in a pixel unit decrease in area by 20% relative to the first sub-pixels in a preceding pixel unit.

In some embodiments of the present disclosure, the plurality of first sub-pixels decrease in area gradually in a long-edge direction of the plurality of first sub-pixels.

In some embodiments of the present disclosure, the plurality of first sub-pixels decrease in area gradually in a short-edge direction of the plurality of first sub-pixels.

In some embodiments of the present disclosure, the plurality of first sub-pixels decrease in area gradually in a diagonal direction of the plurality of first sub-pixels.

In some embodiments of the present disclosure, the boundary extending in non-straight line is circular-arc shaped, and the plurality of first sub-pixels decrease in area gradually in a radial direction of the boundary extending in non-straight line.

In some embodiments of the present disclosure, the plurality of second sub-pixels are equal in area.

In some embodiments of the present disclosure, a smallest-area first sub-pixel of the plurality of first sub-pixels has an area which is 40% of an area of each second sub-pixel.

In some embodiments of the present disclosure, short edges of the plurality of first sub-pixels are equal or nearly equal in length to short edges of the plurality of second sub-pixels, and a short edge of each first sub-pixel is aligned with or nearly aligned with a short edge of a second sub-pixel in a same column as the first sub-pixel.

In some embodiments of the present disclosure, the plurality of first sub-pixels are sub-pixels whose minimum distances to the boundary extending in non-straight line are less than the preset threshold.

In some embodiments of the present disclosure, the plurality of first sub-pixels are all sub-pixels in a preset area, and the preset area is an area in the display area that is adjacent to the boundary extending in non-straight line and is determined according to the preset threshold.

Some embodiments of the present disclosure provide a method of manufacturing a display substrate whose display area has a boundary extending in non-straight line, including: manufacturing in the display area a plurality of first sub-pixels whose distances to the boundary extending in non-straight line are less than a preset threshold and a plurality of second sub-pixels other than the plurality of first sub-pixels, where at least one of the first sub-pixels is smaller in area than each of the second sub-pixels.

In some embodiments of the present disclosure, manufacturing the plurality of first sub-pixels includes: manufacturing in the display area a plurality of first sub-pixels decreasing in area gradually in a direction pointing from a center of the display area to the boundary extending in non-straight line of the display area.

Some embodiments of the present disclosure provide a display device, including the display substrate provided by any one of foregoing embodiments of the present disclosure.

DETAILED DESCRIPTION

To describe the technical solutions of the present disclosure more clearly, a detailed description with reference to accompanying drawings and some embodiments is provided below. In the following description, details such as specific configuration and components are given merely to facilitate a comprehensive understanding of the present disclosure. Therefore, it is appreciated by a person skilled in the art that, many modifications or substitutions may be made in the embodiments described herein.

It is understood, "one embodiment" or "some embodiments" mentioned throughout the specification means that features, structures or characteristics related to the embodiment are included in at least one embodiment of this disclosure. Therefore, "in one embodiment" or "in some embodiments" mentioned throughout the specification does not necessarily refer to the same embodiment. Additionally, these specific features, structures or characteristics may be combined in any suitable manner in one or more embodiments.

In embodiments of the present disclosure, it is understood, the numbering of various processes described below is not intended to imply an execution sequence. The execution sequence of the processes should be determined in accordance with the functions and inherent logic thereof, and by no means constitutes any limitation as to the implementation of the embodiments of this disclosure.

In the related art, the sub-pixel area of a display product is rectangular, and the arrangement of the sub-pixels cannot match exactly (i.e., coincide exactly) with the circular-arc shaped boundary of the display area. As a result, a relatively obvious saw-tooth pattern (or coarse-grained pattern) appears in the displayed image in the vicinity of the circular-arc shaped boundary, and may be observed by a user with naked eyes, thereby degrading user experience with respect to displayed image. The technical solution provided by embodiments of the present disclosure may resolve the problem of the saw-tooth pattern appearing in an image displayed by a display product in which a boundary of a display area does not match with a shape of sub-pixels.

Figure 1:
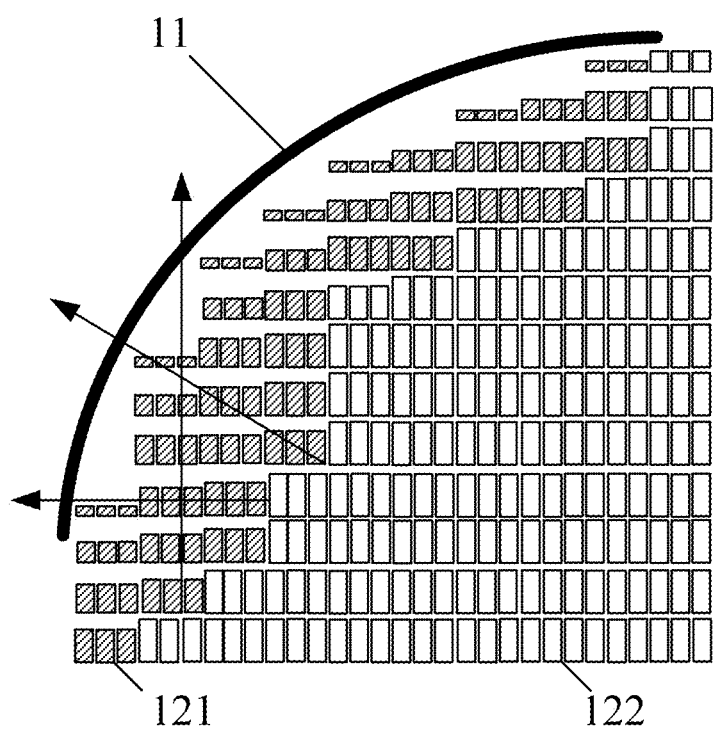
FIG. 1 is a schematic diagram of a display substrate provided by some embodiments of the present disclosure.

Some embodiments of the present disclosure provide a display substrate. As shown in FIG. 1, the display substrate includes a plurality of sub-pixels (rectangular blocks as shown in FIG. 1) in a display area. The display area includes a boundary 11 extending in non-straight line. The display substrate includes the display area.

As an example, the boundary 11 extending in non-straight line includes a circular-arc shaped boundary which does not match with the shape of sub-pixels.

In some embodiments, the boundary 11 extending in non-straight line includes a right-angled boundary (e.g., a right angle formed by two intersecting boundaries).

In some embodiments, the boundary 11 extending in non-straight line does not include a right-angled boundary (e.g., a right angle formed by two intersecting boundaries).

The plurality of sub-pixels arranged in an array include a plurality of first sub-pixels 121 (shaded rectangular blocks as shown in FIG. 1) whose distances to the boundary 11 extending in non-straight line are less than a preset threshold and a plurality of second sub-pixels 122 (white rectangular blocks as shown in FIG. 1) other than the plurality of first sub-pixels, and at least one of the first sub-pixels 121 is smaller in area than the second sub-pixel.

In some embodiments of the present disclosure, the first sub-pixel refers to a sub-pixel whose absolute distance (e.g., the absolute distance is a shortest distance between the first sub-pixel and the boundary 11 extending in non-straight line) to the boundary 11 extending in non-straight line is less than a preset threshold.

In some embodiments of the present disclosure, an area adjacent to the boundary 11 extending in non-straight line is determined according to a preset threshold, and all sub-pixels in the area are the first sub-pixels 121.

The second sub-pixel 122 is a sub-pixel for display in the display substrate other than the first sub-pixel, and all the second sub-pixels 122 are equal in area.

In the technical solution of foregoing embodiment, considering that a luminance of a sub-pixel is in direct proportion to its area, the luminance of the first sub-pixel is reduced by decreasing the area of the first sub-pixel in the vicinity of the boundary extending in non-straight line of the display area, so as to lessen the sudden change of luminance at the boundary extending in non-straight line and blur the saw-tooth pattern in image, thereby improving the display quality of image.

The technical solution of the foregoing embodiment of the present disclosure merely changes the size of the first sub-pixels, and requires no additional adjustment to data lines, scan lines or a black matrix, thereby the foregoing embodiment is simple to implement.

In some embodiments of the present disclosure, as shown in FIG. 1, in the display area of the display substrate, the first sub-pixels 121 decrease in area gradually in a direction from a position away from the boundary 11 extending in non-straight line to a position close to the boundary 11 extending in non-straight line (for example, as shown by three arrows in FIG. 1), to achieve a transition of luminance.

In some embodiments of the present disclosure, in the display area, the plurality of first sub-pixels decrease in area gradually in a direction pointing from a center of the display area to the boundary 11 extending in non-straight line of the display area.

This design reduces a user's perception of the luminance change at the boundary extending in non-straight line in a displayed image, renders an image in the vicinity of the boundary 11 extending in non-straight line more natural and smooth, and eliminates the appearance of saw-tooth pattern.

Figure 2:
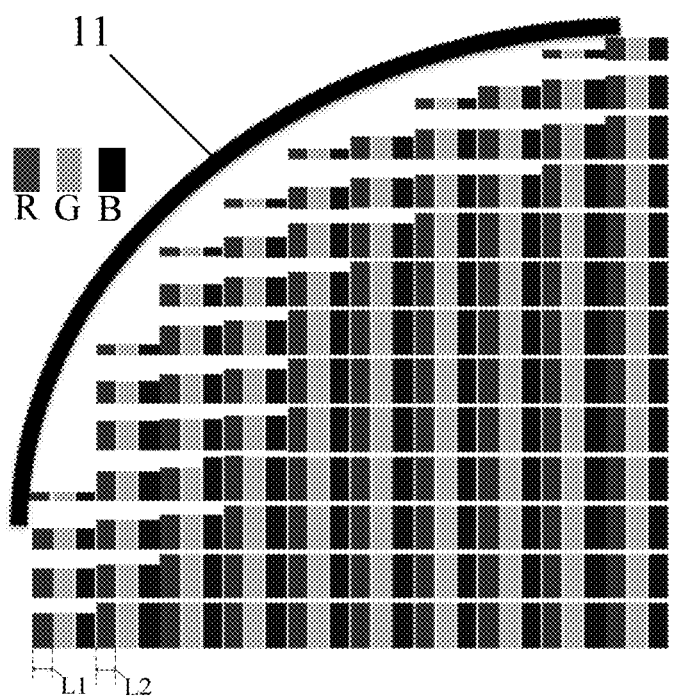
FIG. 2 is another schematic diagram of a display substrate provided by some embodiments of the present disclosure.

As an example, as shown in FIG. 2, the plurality of sub-pixels (including the first sub-pixels and the second sub-pixels) in the display substrate provided by some embodiments of the present disclosure come in three colors, that is, the plurality of sub-pixels in the display substrate include red sub-pixels R, green sub-pixels G and blue sub-pixels B. The sub-pixels R, G and B are basic single-color sub-pixels of the display substrate.

In some embodiments of the present disclosure, the plurality of sub-pixels in the display area form a plurality of pixel units arranged in an array, and each pixel unit includes three sub-pixels in different colors and arranged in a row direction. In another word, three single-color sub-pixels R, G and B in a transverse direction form one pixel unit.

In some embodiments of the present disclosure, in the display area, the plurality of first sub-pixels decrease in area gradually in the direction from a position away from the boundary 11 extending in non-straight line to a position close to the boundary 11 extending in non-straight line at a granularity of at least one pixel unit each formed by the first sub-pixels.

In some embodiments of the present disclosure, in the display area, the plurality of first sub-pixels 121 decrease in area gradually in the direction pointing from a center of the display area to the boundary 11 extending in non-straight line of the display area at a granularity of at least one pixel unit each formed by the first sub-pixels 121.

Based on the structure design of the plurality of first sub-pixels, it may be ensured that the three basic single-color sub-pixels R, G and B in one pixel unit formed by the first sub-pixels decrease in area simultaneously, such that the single-color sub-pixels in each pixel unit have identical area, thereby preventing a color shift phenomenon from occurring to the displayed image.

In some embodiments of the present disclosure, a smallest-area first sub-pixel of the plurality of first sub-pixels has an area which is 40% of an area of a second sub-pixel.

In some embodiments of the present disclosure, in the direction from a position away from the boundary extending in non-straight line to a position close to the boundary extending in non-straight line, the first sub-pixels in a pixel unit decrease in area by 20% relative to the first sub-pixels in a preceding pixel unit.

In some embodiments of the present disclosure, in the direction pointing from the center of the display area to the boundary extending in non-straight line of the display area, the first sub-pixels in a pixel unit decrease in area by 20% relative to the first sub-pixels in a preceding pixel unit.

Figure 3:
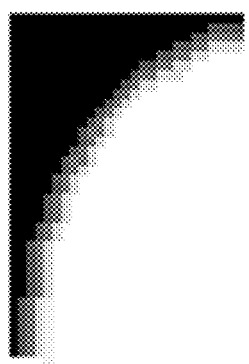
FIG. 3 is a schematic diagram of a displayed image at the position of a boundary extending in non-straight line corresponding to the display substrate provided by some embodiments of the present disclosure.
Figures 4, 5:
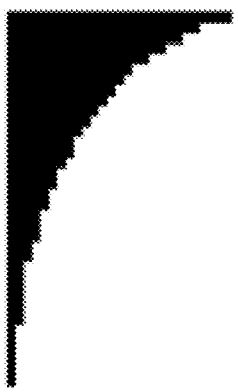
FIG. 4 is a schematic diagram of a displayed image at the position of a boundary extending in non-straight line corresponding to a display substrate in the related art.
FIG. 5 is a flow diagram of a method of manufacturing a display substrate provided by some embodiments of the present disclosure.

In the foregoing embodiment, when the first sub-pixels decrease in area by 20% regularly, a visual effect of luminance change as shown in FIG. 3 is presented. In comparison with a displayed image at a boundary extending in non-straight line of a display substrate in the related art as shown in FIG. 4, the luminance transition at the boundary extending in non-straight line of the image in FIG. 3 is more natural, thereby lessening the appearance of saw-tooth pattern at this position.

In some embodiments of the present disclosure, in the direction pointing from the center of the display area to the boundary 11 extending in non-straight line of the display area, the plurality of first sub-pixels 121 decrease in area by an irregular magnitude.

For example, in the direction pointing from the center of the display area to the boundary 11 extending in non-straight line of the display area, the plurality of first sub-pixels have areas which are respectively 95%, 80%, 75% and 60% of an area of a sub-pixel at the center.

For another example, in the direction pointing from the center of the display area to the boundary 11 extending in non-straight line of the display area, the plurality of first sub-pixels have areas which are respectively 90%, 80%, 80% and 60% of an area of a sub-pixel at the center.

Since the first sub-pixels vary in area relative to the second sub-pixels, a mura phenomenon tends to occur in the displayed image.

In some embodiments of the present disclosure, the plurality of first sub-pixels 121 decrease in area gradually in a long-edge direction of the plurality of first sub-pixels 121.

In some embodiments of the present disclosure, the plurality of first sub-pixels 121 decrease in area gradually in a short-edge direction of the plurality of first sub-pixels 121.

In some embodiments of the present disclosure, the plurality of first sub-pixels 121 decrease in area gradually in a diagonal direction of the plurality of first sub-pixels 121.

In some embodiments of the present disclosure, the boundary 11 extending in non-straight line is circular-arc shaped, and the plurality of first sub-pixels 121 decrease in area gradually in a radial direction of the boundary 11 extending in non-straight line.

In some embodiments of the present disclosure, as shown in FIG. 2, lengths L1 of short edges (i.e., an edge parallel to or nearly parallel to a row direction) of the first sub-pixels are the same or nearly the same as lengths L2 of short edges of the second sub-pixels, and a short edge of a first sub-pixel is aligned with or nearly aligned with a short edge of a second sub-pixel in a same column as the first sub-pixel.

In the foregoing embodiment, only length of the long edge of the first sub-pixel is changed, while length of the short edge of the first sub-pixel remains unchanged or only changes a little, thereby it is ensured that sub-pixels in the same color in a column direction remains aligned, preventing a mura phenomenon in a column direction from occurring in the displayed image.

Some embodiments of the present disclosure provide a method of manufacturing a display substrate. The display substrate includes a plurality of sub-pixels in a display area. The display area has a boundary extending in non-straight line. As shown in FIG. 5, the method of manufacturing the display substrate includes a step 110.

In the step 110: manufacturing in the display area a plurality of first sub-pixels whose distances to the boundary extending in non-straight line are less than a preset threshold and a plurality of second sub-pixels other than the plurality of first sub-pixels, where at least one of the first sub-pixels is smaller in area than each of the second sub-pixels.

The method of the foregoing embodiment is configured to manufacture the display substrate provided by any one aforementioned embodiment of the present disclosure, thus the method of this embodiment may achieve the same technical effect as that achieved by the display substrate.

In some embodiments of the present disclosure, the step of manufacturing the plurality of first sub-pixels includes: manufacturing in the display area a plurality of first sub-pixels decreasing in area gradually in a direction from a position away from the boundary extending in non-straight line to a position close to the boundary extending in non-straight line.

In some embodiments of the present disclosure, the step of manufacturing the plurality of first sub-pixels includes: manufacturing in the display area a plurality of first sub-pixels decreasing in area gradually in a direction pointing from a center of the display area to the boundary extending in non-straight line of the display area.

As an example, the first sub-pixel in a position in proximity to the boundary 11 extending in non-straight line has an area which is 20% of an area of the second sub-pixel. In a direction away from the boundary 11 extending in non-straight line or in a direction pointing from the boundary 11 extending in non-straight line to the center of the display area, the first sub-pixels increase in area gradually, i.e., in the direction away from the boundary 11 extending in non-straight line, the first sub-pixels have areas which are respectively 40%, 60% and 80% of the area of the second sub-pixel. In some embodiments of the present disclosure, the pixel electrodes of the plurality of manufactured first sub-pixels have an area smaller than an area of the pixel electrode of each second sub-pixel.

In some embodiments of the present disclosure, prior to the manufacturing of pixel electrodes on the display substrate, the method includes depositing a passivation layer with a thickness of 2000 Å to 1000 Å by means of a magnetron sputtering, thermal evaporation, plasma enhanced chemical vapor deposition (PECVD) or other film-forming process. The passivation layer is provided for planarization, to allow for a smaller level difference between subsequently formed pixel electrodes.

In some embodiments of the present disclosure, the material from which passivation layer is made includes an oxide, a nitride or an oxynitride.

In some embodiments of the present disclosure, the material from which passivation layer is made includes SiNx, SiOx or Si(ON)x.

In some embodiments of the present disclosure, the passivation layer includes $Al_2O_3$.

In some embodiments of the present disclosure, the passivation layer is of a single-layer structure.

In some embodiments of the present disclosure, the passivation layer is of a dual-layer structure composed of a silicon nitride and a silicon oxide.

In some embodiments of the present disclosure, a reaction gas corresponding to a silicon oxide includes $SiH_4$ and $N_2O$, and a reaction gas corresponding to a silicon nitride or oxynitride includes $SiH_4$, $NH_3$, $N_2$, or $SiH_2Cl_2$, $NH_3$, $N_2$.

In some embodiments of the present disclosure, a passivation layer pattern including via holes is formed by using a patterning process. For example, a layer of organic resin, e.g. benzocyclobutene (BCB) or other organic photosensitive material, with a thickness of about 4000 Å to 30000 Å is applied on the passivation layer. After an exposure and development, an etching process is used to form a passivation layer pattern with via holes for the pixel electrodes.

After the passivation layer pattern with via holes is formed, a transparent conductive layer with a thickness of about 300 Å to 1500 Å is deposited by a sputtering or thermal evaporation process, where the transparent conductive layer is made of Indium tin oxide (ITO), Indium zinc oxide (IZO) or other transparent metal oxide, for example; a layer of photoresist is applied on the transparent conductive layer, and an exposure is performed on the photoresist by using a mask to form a region in which the photoresist is to be removed and a region in which the photoresist remains. The mask is provided with openings corresponding to a size of the sub-pixels.

Different from the mask in the related art, the mask in some embodiments of the present disclosure includes openings corresponding to the first sub-pixels and opening corresponding to the second sub-pixels, where the area of each opening corresponding to the first sub-pixel is smaller than the area of each opening corresponding to the second sub-pixel. After the exposure is completed, the region in which the photoresist remains corresponds to the location of a pixel electrode and includes a region corresponding to a to-be-formed first sub-pixel and a region corresponding to a to-be-formed second sub-pixel.

After the exposure is completed, a development process is performed to completely remove the photoresist in the region in which the photoresist is to be removed, and the photoresist in the region in which the photoresist remains is unchanged in thickness. Subsequently, an etching process is used to completely etch the transparent conductive film in the region in which the photoresist is to be removed, and the remaining photoresist is removed, so as to form a pattern of the pixel electrode of the first sub-pixel and a pattern of the pixel electrode of the second sub-pixel; these pixel electrodes are connected by means of the via holes in the aforementioned planarization layer to a drain electrode formed on the display substrate.

The method of manufacturing the display substrate according to the foregoing embodiment of the present disclosure only makes modification to a mask for forming pixel electrodes and no additional process is added, thereby a production efficiency of display substrate won't be lowered and the method is easy to implement.

Some embodiments of the present disclosure provide a display device including the display substrate provided by any one of foregoing embodiments of the present disclosure. Thus, the display device of this embodiment may achieve the same technical effect as that achieved by the display substrate.

Based on the display substrate provided by foregoing embodiments of the present disclosure, in the display device provided by this embodiment, sub-pixels in the vicinity of the boundary extending in non-straight line of the display area have an area smaller than other sub-pixels, thereby lessening the appearance of saw-tooth pattern in these positions of displayed image, improving the display quality of image and enhancing user experience.

In some embodiments of the present disclosure, the display substrate is of a single-substrate structure (e.g., applied to an organic light-emitting diode (OLED) display product), or of a display panel structure composed of two substrates oppositely arranged to form a cell (e.g., applied to a liquid crystal (LC) display product).

In some embodiments of the present disclosure, the display device includes any product or component provided with a display function, such as a liquid crystal TV set, a liquid crystal display, a digital photo frame, a mobile phone, a tablet computer. For example, the display device refers to a display product with a high screen-to-body ratio, such as a bezel-less display equipment and an intelligent wearable equipment. Since the display area of these products almost occupies the entire display surface, the boundary of the display area matches with a frame of the product, leading to a display area boundary extending in non-straight line (e.g., at four rounded corners of the display area, and at the "bangs" region in the display area where a camera is disposed), and therefore not being able to match with rectangular sub-pixels.

The display device according to the aforementioned embodiment of the present disclosure lessens, by reducing the luminance of sub-pixels in the vicinity of the display area boundary extending in non-straight line, the appearance of saw-tooth pattern in these positions of displayed image, thereby improving the display quality of image and enhancing user experience.

The above descriptions merely describe some implementations of this disclosure. It is appreciated, modifications and improvements may be made by a person of ordinary skill in the art without departing from the principle of this disclosure.

Unless defined otherwise, all technical or scientific terms used herein have the same meaning as commonly understood by one of ordinary skill in the art to which the present disclosure belongs. The terms "comprise", "include" and the like used in the present disclosure refer to that an element or article preceding the term not only encompasses elements or articles listed after the term and equivalents of the elements or articles listed, but also may encompass other elements or articles.

What is claimed is:

1. A display substrate, comprising:
a plurality of sub-pixels arranged in an array in a display area,
wherein the display area comprises a boundary extending in a non-straight line, the plurality of sub-pixels arranged in the array comprise a plurality of first sub-pixels whose distances to the boundary are less than a preset threshold and a plurality of second sub-pixels other than the plurality of first sub-pixels, and at least a portion of the plurality of first sub-pixels is smaller in area than each of the plurality of second sub-pixels, and wherein the plurality of first sub-pixels are all smaller in area than each of the second sub-pixels, wherein in the display area, the plurality of first sub-pixels decrease in area in a direction from a center of the display area to the boundary, and wherein the boundary is circular-arc shaped, and the plurality of first sub-pixels decrease in area in a radial direction of the boundary.

2. The display substrate according to claim 1, wherein, the plurality of sub-pixels comprise a plurality of pixel units arranged in an array, wherein each pixel unit comprises three sub-pixels in different colors and arranged in a row direction; and in the display area, the plurality of pixel units decrease in area in the direction from the center of the display area to the boundary.

3. The display substrate according to claim 2, wherein, in the direction from the center of the display area to the boundary, the first sub-pixels in a pixel unit decrease in area by 20% relative to the first sub-pixels in a neighboring pixel unit.

4. The display substrate according to claim 1, wherein the plurality of first sub-pixels decrease in area in a first edge direction of the plurality of first sub-pixels, wherein the first edge direction is parallel to a long edge of the second sub-pixels.

5. The display substrate according to claim 1, wherein the plurality of first sub-pixels decrease in area in a second edge direction of the plurality of first sub-pixels, wherein the second edge direction is parallel to a short edge of the second sub-pixels.

6. The display substrate according to claim 1, wherein the plurality of first sub-pixels decrease in area in a diagonal direction of the plurality of first sub-pixels.

7. The display substrate according to claim 1, wherein the plurality of second sub-pixels are equal in area.

8. The display substrate according to claim 7, wherein, a first sub-pixel with the smallest area of the plurality of first sub-pixels has an area which is 40% of an area of each second sub-pixel.

9. The display substrate according to claim 1, wherein, second edges of the plurality of first sub-pixels are equal or nearly equal in length to second edges of the plurality of second sub-pixels, and a second edge of each first sub-pixel is aligned with or nearly aligned with a second edge of a second sub-pixel in a same column as the first sub-pixel.

10. A method of manufacturing a display substrate including a display area having a boundary extending in a non-straight line, comprising:

manufacturing in the display area a plurality of first sub-pixels whose distances to the boundary are less than a preset threshold and a plurality of second sub-pixels other than the plurality of first sub-pixels, wherein at least a portion of the plurality of first sub-pixels is smaller in area than each of the plurality of second sub-pixels, wherein the plurality of first sub-pixels are all smaller in area than each of the second sub-pixels, wherein in the display area, the plurality of first sub-pixels decrease in area in a direction from a center of the display area to the boundary, and wherein the boundary is circular-arc shaped, and the plurality of first sub-pixels decrease in area in a radial direction of the boundary.

11. The method according to claim 10, wherein manufacturing the plurality of first sub-pixels comprises:

manufacturing in the display area a plurality of first sub-pixels decreasing in area in a direction from a center of the display area to the boundary.

12. A display device, comprising the display substrate according to claim 1.

* * * * *